United States Patent [19]

Hill

[11] Patent Number: 5,710,068
[45] Date of Patent: Jan. 20, 1998

[54] LOW THERMAL IMPEDANCE INTEGRATED CIRCUIT

[75] Inventor: Darrell G. Hill, Plano, Tex.

[73] Assignee: Texas Instruments Incorporated, Dallas, Tex.

[21] Appl. No.: 476,832

[22] Filed: Jun. 7, 1995

Related U.S. Application Data

[62] Division of Ser. No. 159,648, Nov. 30, 1993.

[51] Int. Cl.$^6$ .................................................. H01L 21/265
[52] U.S. Cl. .................... 437/415 M; 437/187; 437/209; 437/184
[58] Field of Search ........................ 437/209, 415 M, 437/187, 40 GS, 180, 184

[56] References Cited

U.S. PATENT DOCUMENTS

| | | | |
|---|---|---|---|
| 4,794,093 | 12/1988 | Tong et al. | 437/203 |
| 4,992,764 | 2/1991 | Ayasli | 333/247 |
| 5,023,993 | 6/1991 | Fengelly | 29/843 |
| 5,084,750 | 1/1992 | Alderstein | 357/34 |
| 5,202,752 | 4/1993 | Honjo | 257/678 |

FOREIGN PATENT DOCUMENTS 0 446 125 A1  5/1991  European Pat. Off. ...... H01L 23/367

OTHER PUBLICATIONS

W.S. Wong, et al., *"Flip Chip Manufacturing Technology for GaAs MMIC,"* Hughes Aircraft Company, Microelectronic Circuits Division, 1993 GaAs Mantech, Conf., pp. 224–227.

*Primary Examiner*—Trung Dang
*Attorney, Agent, or Firm*—Christopher L. Maginniss; W. James Brady, III; Richard L. Donaldson

[57] ABSTRACT

A frontside ground plane (306) integrated circuit with backside contacts (312) plus optional passive components such as microstrip (308) and capacitors. The frontside ground plane provides direct heat dissipation from active junctions such as heterojunction and field effect transistors.

12 Claims, 14 Drawing Sheets

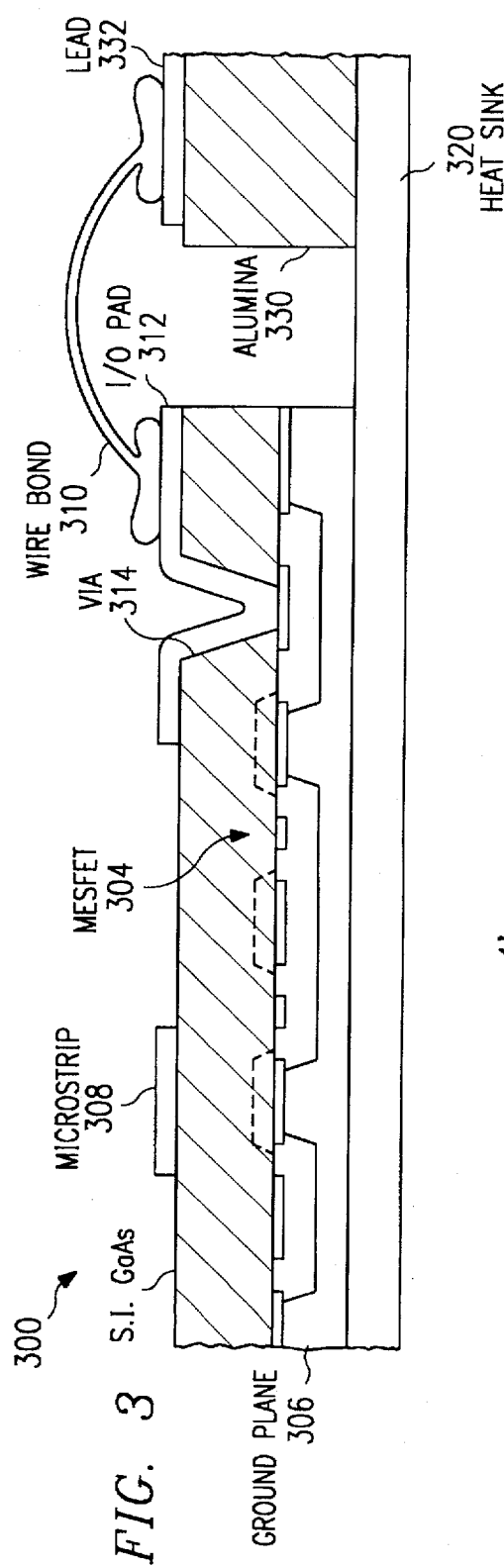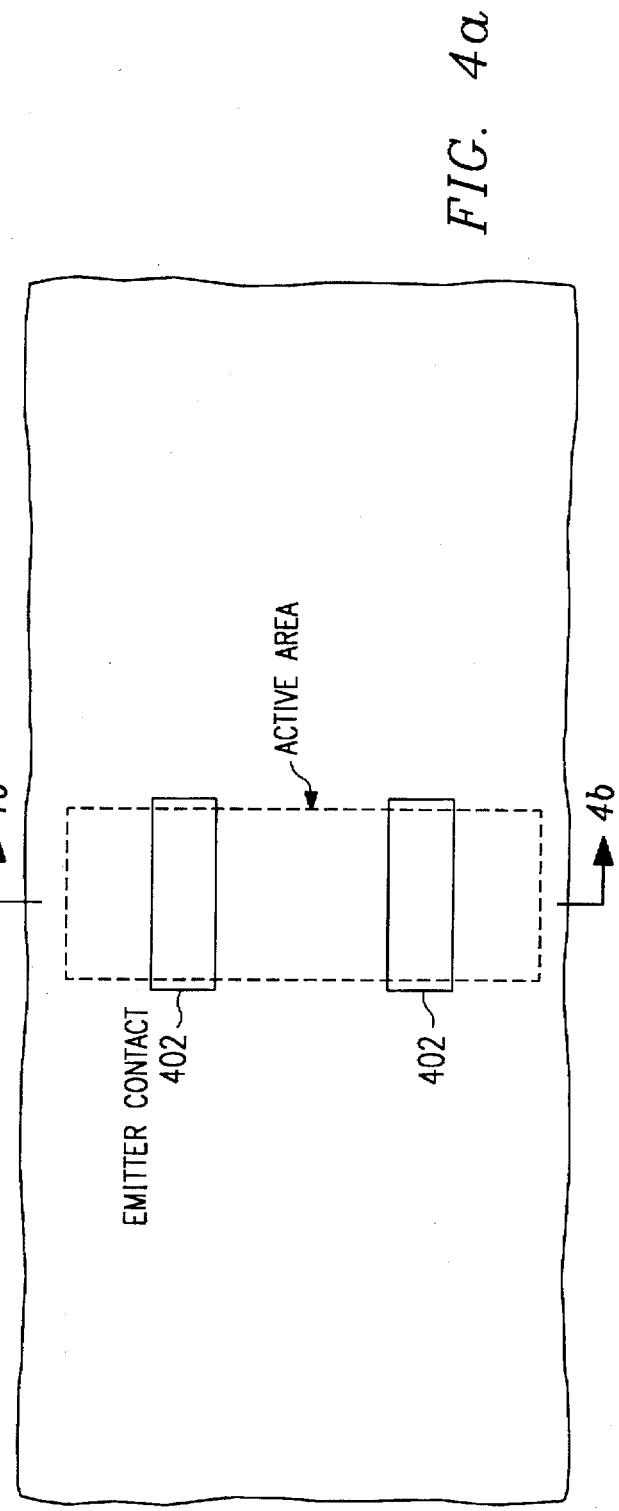

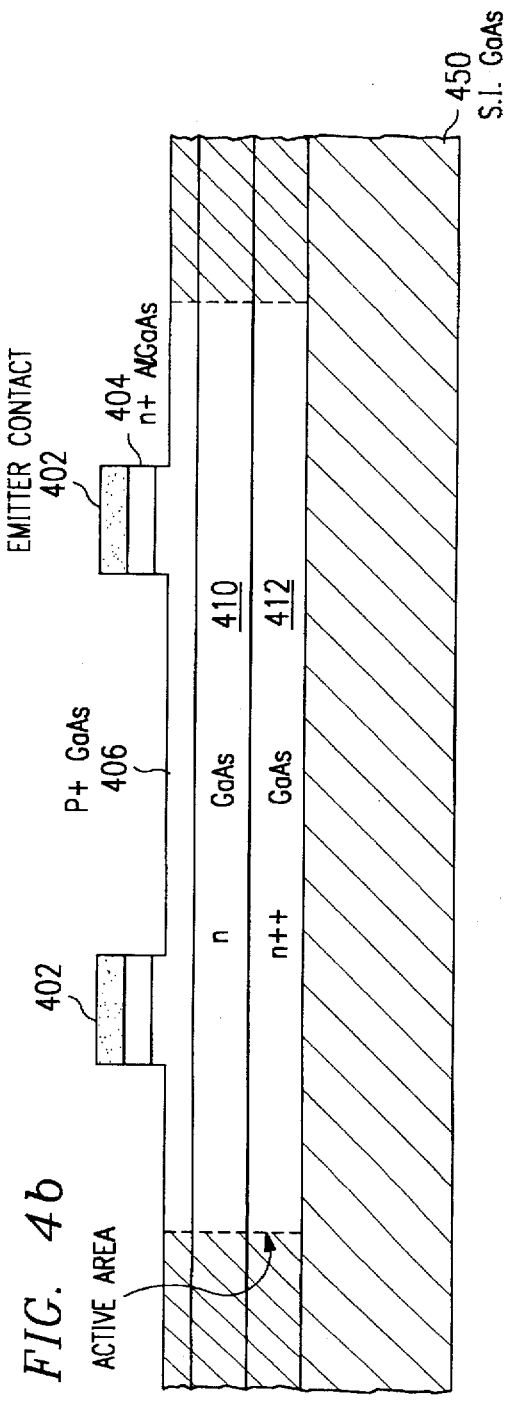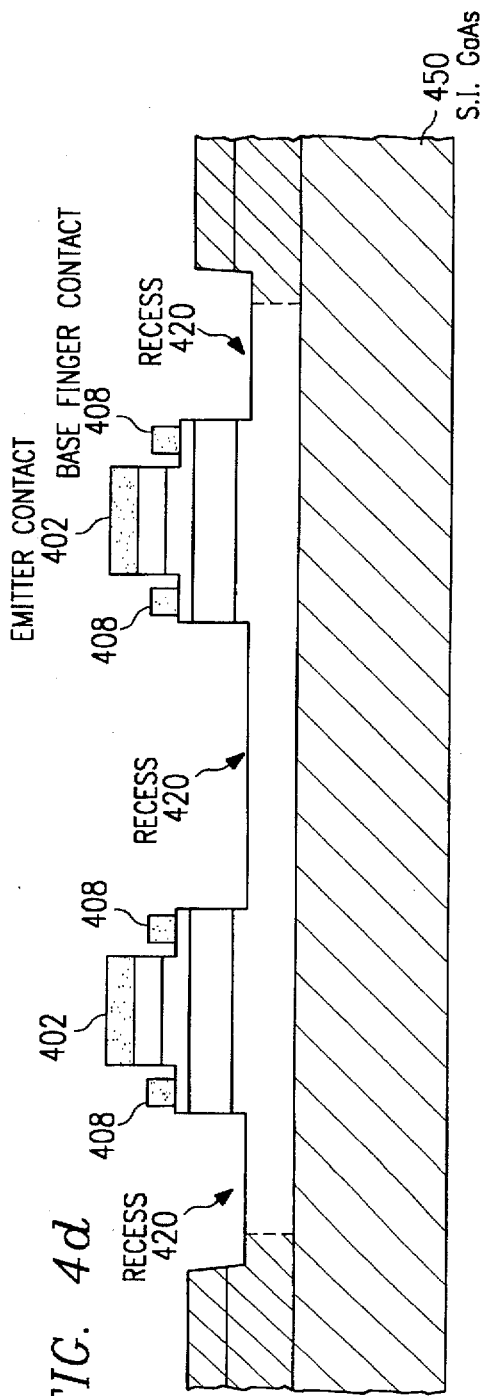

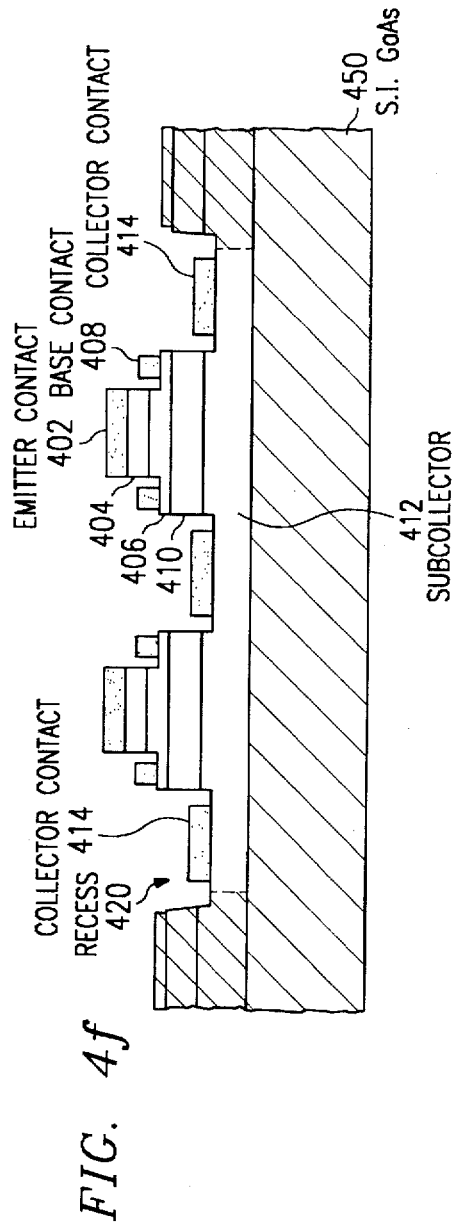
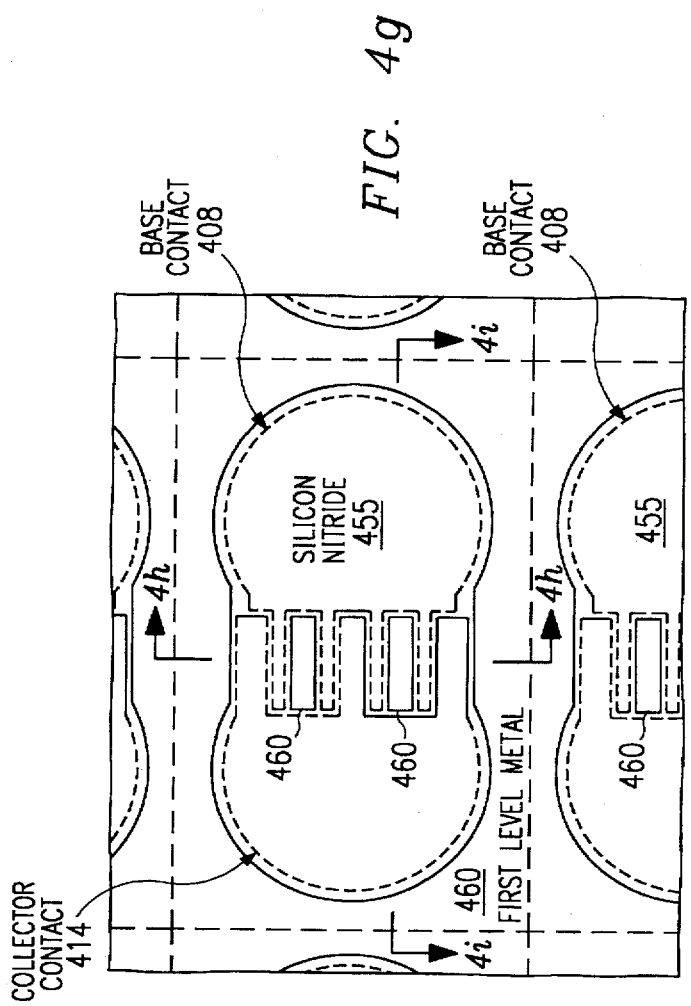

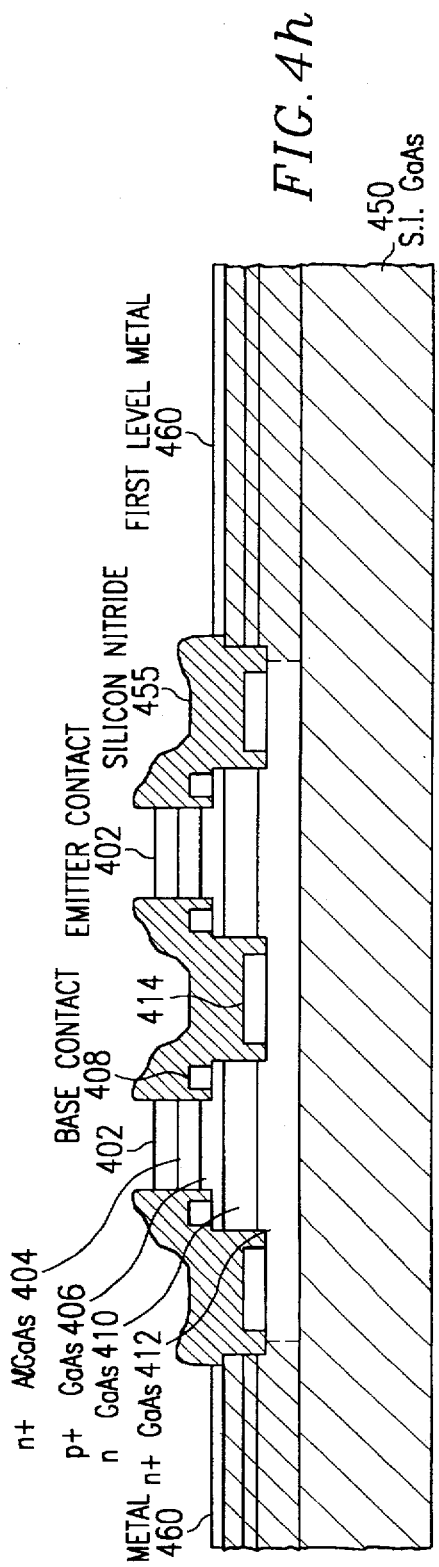
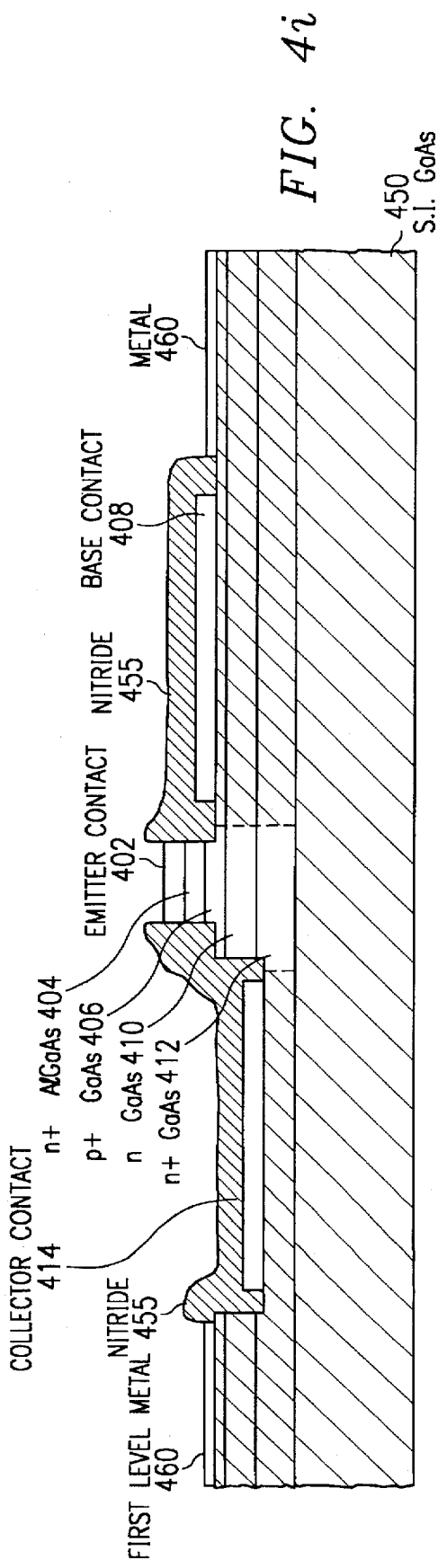

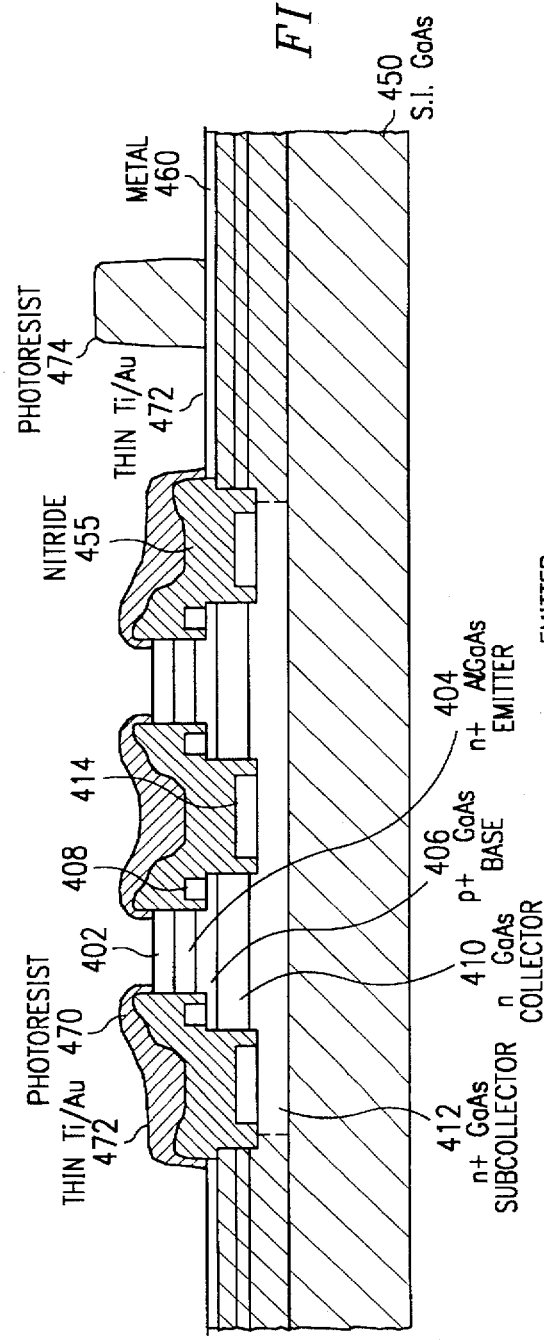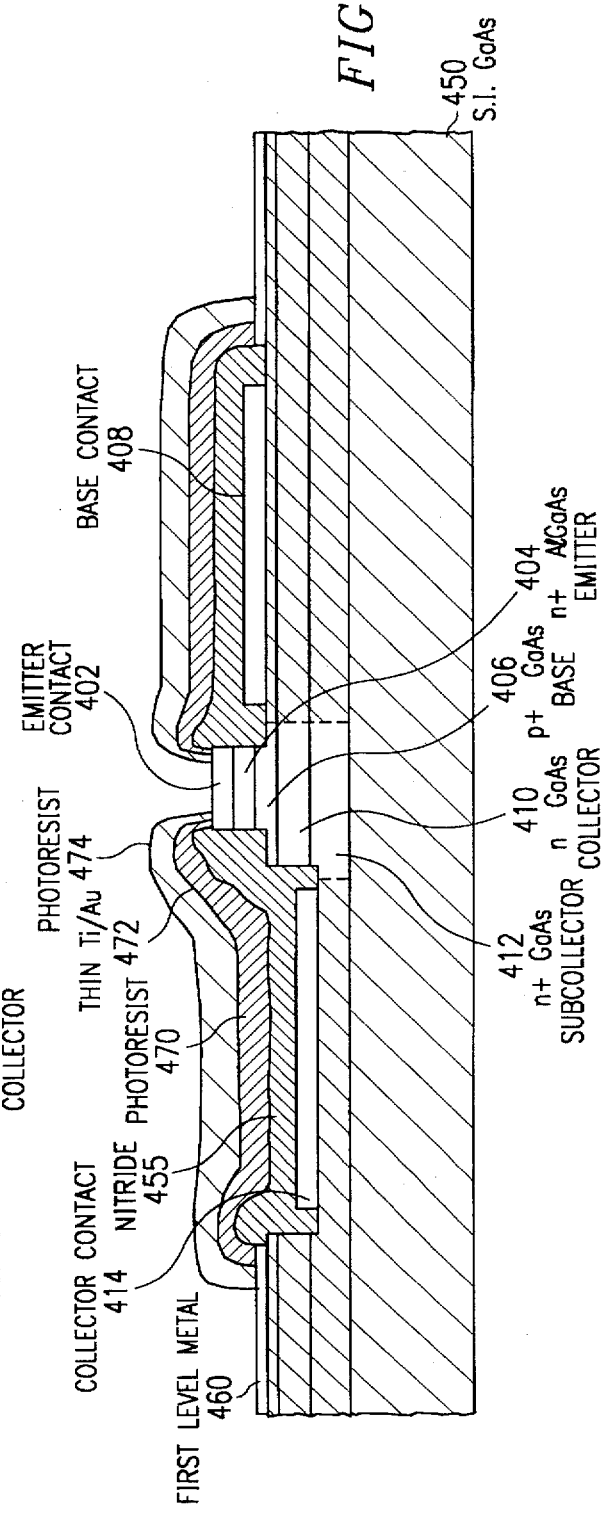

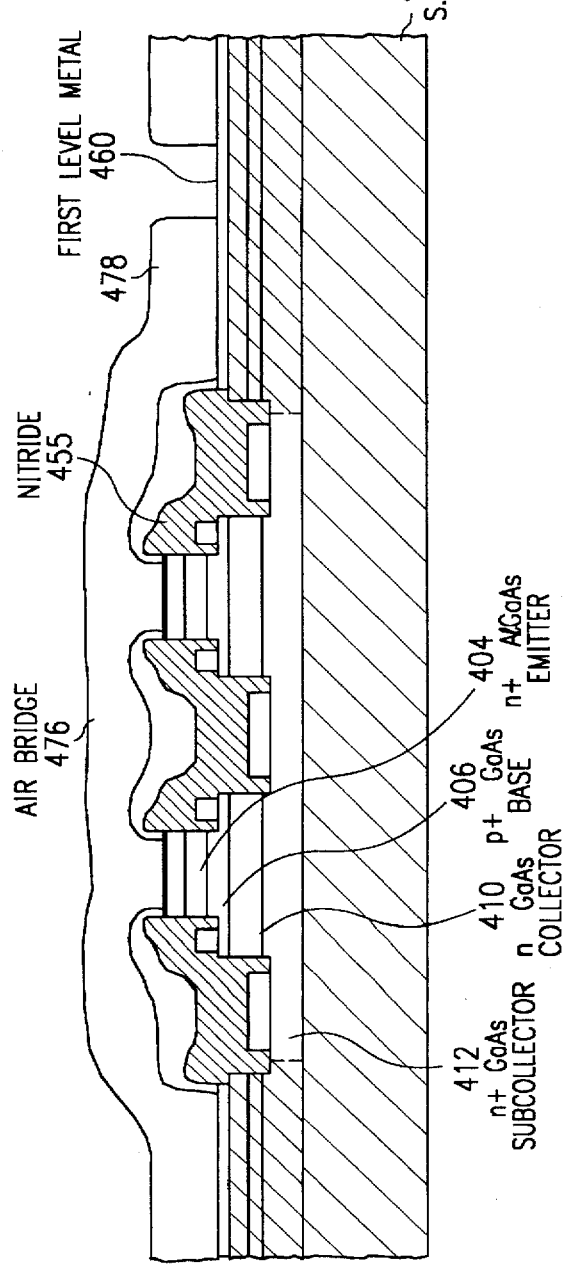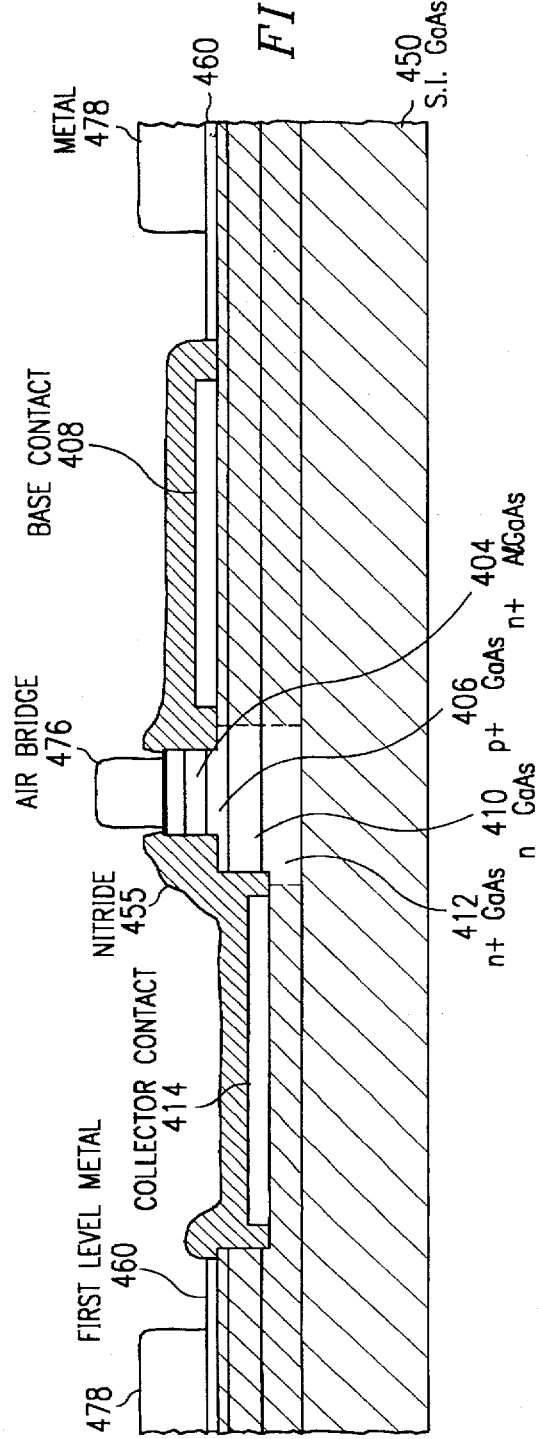

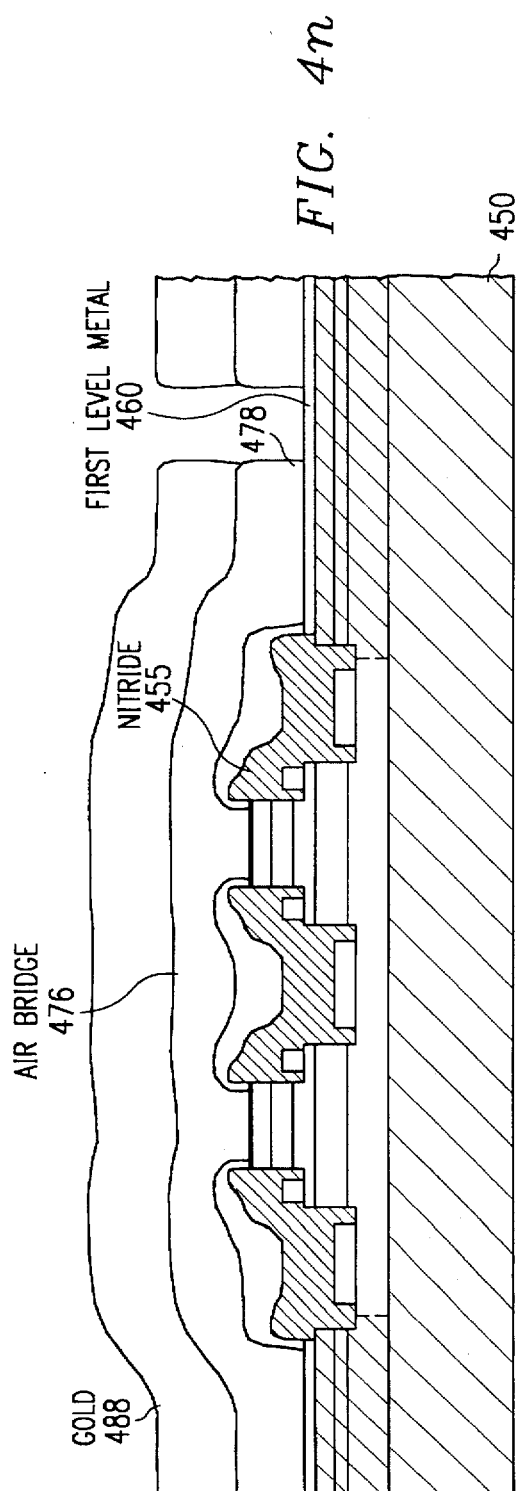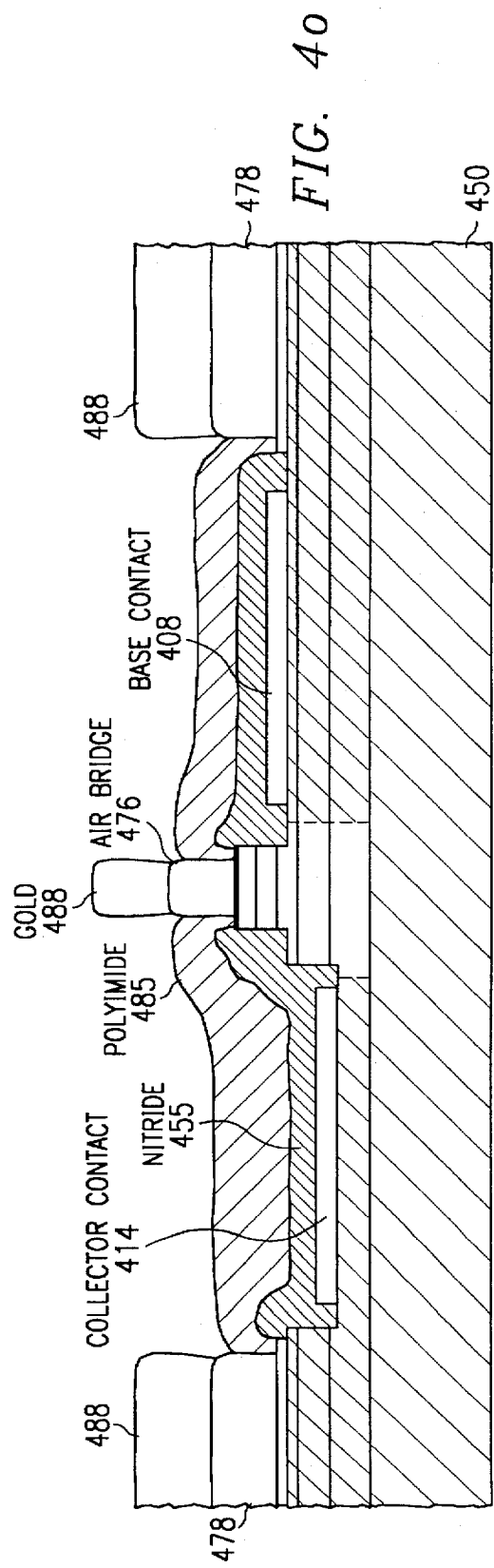

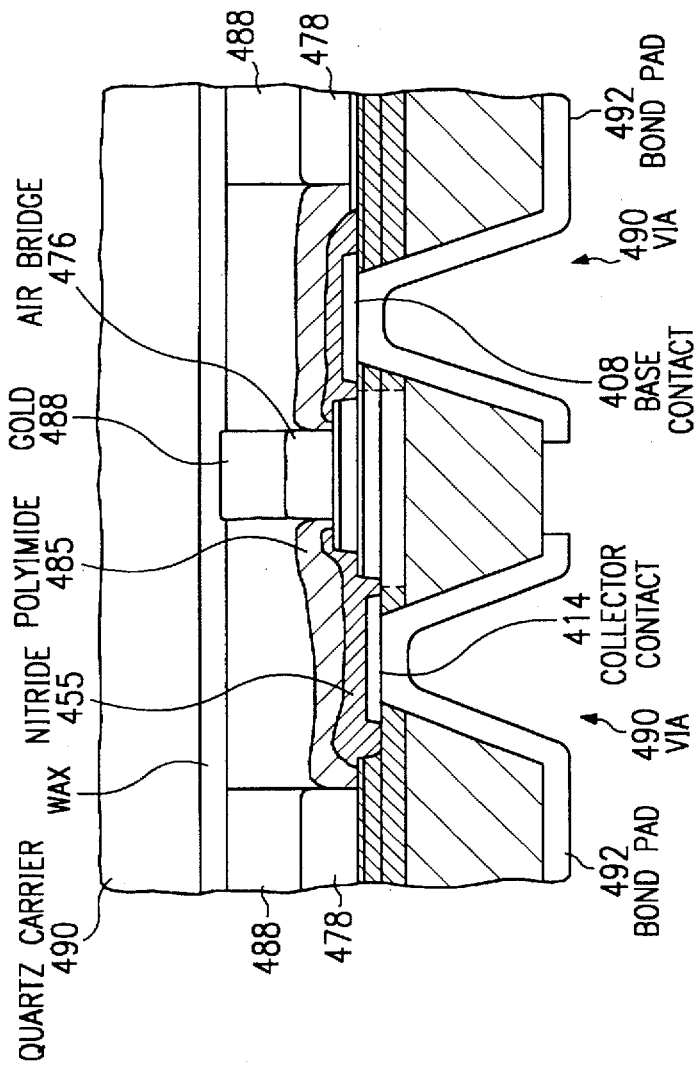

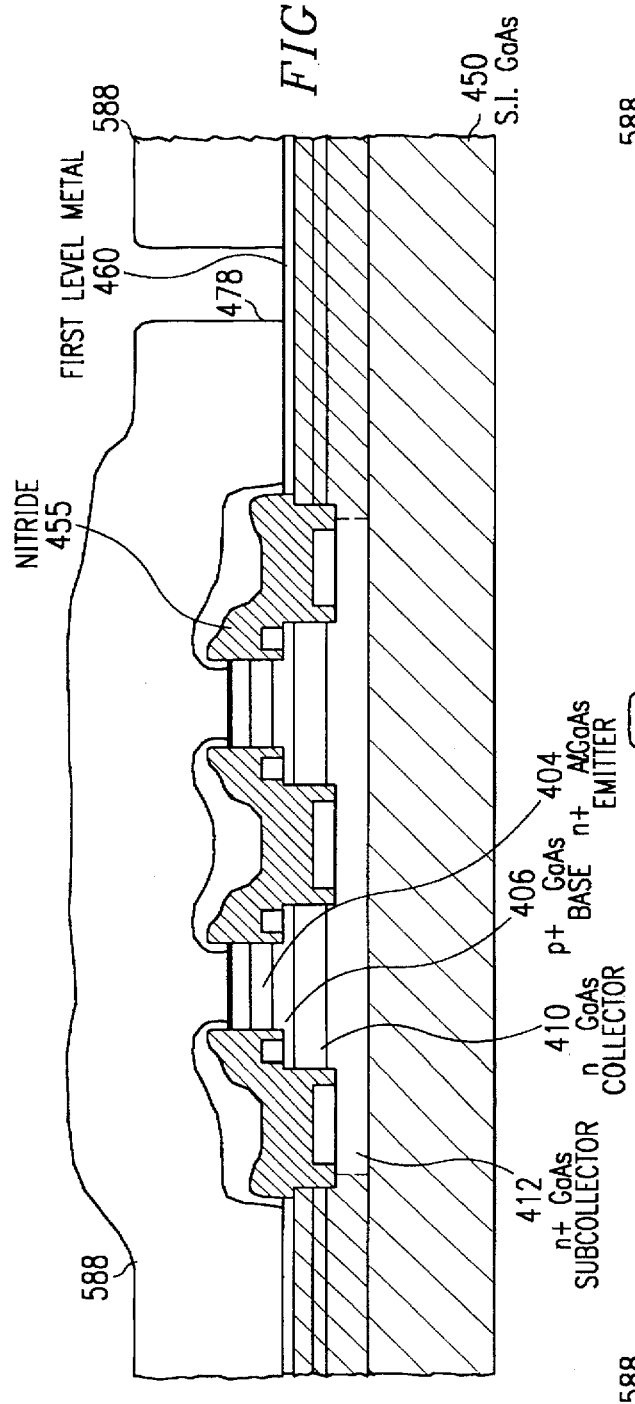
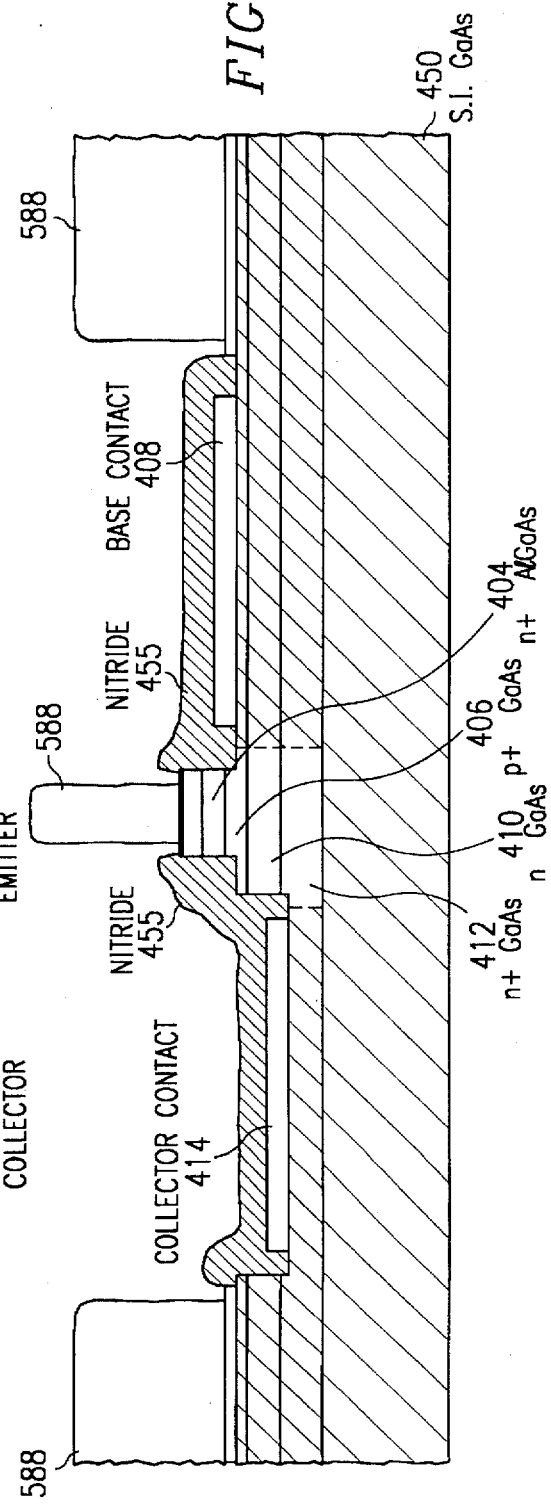

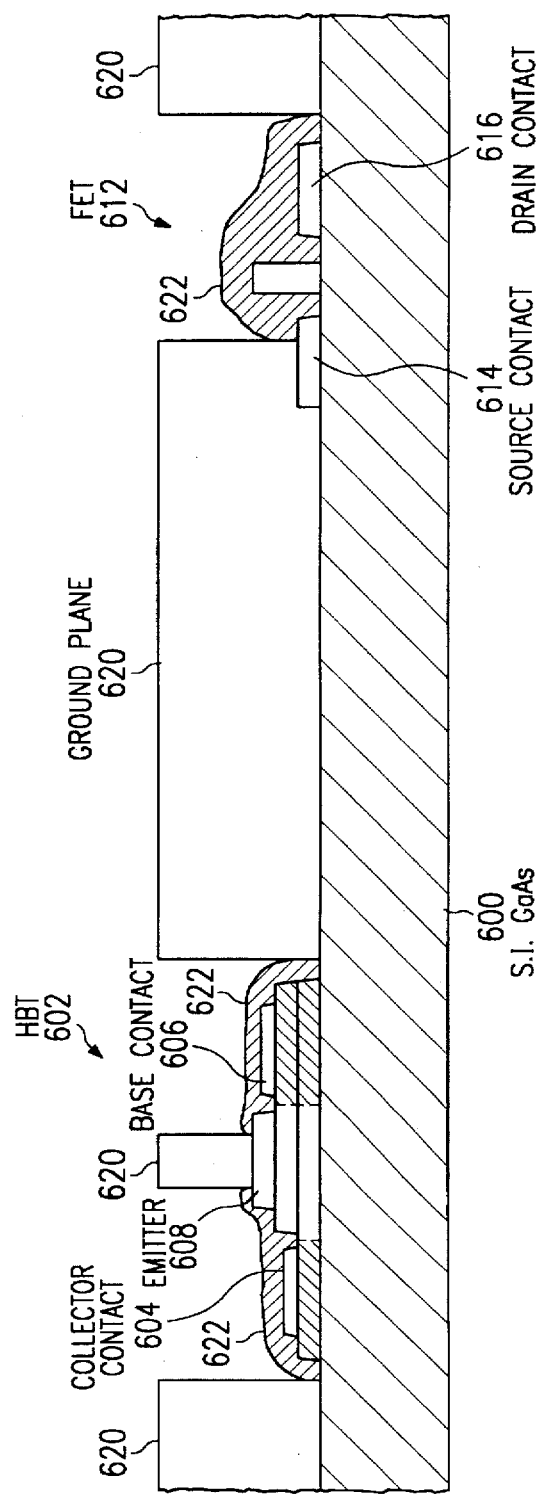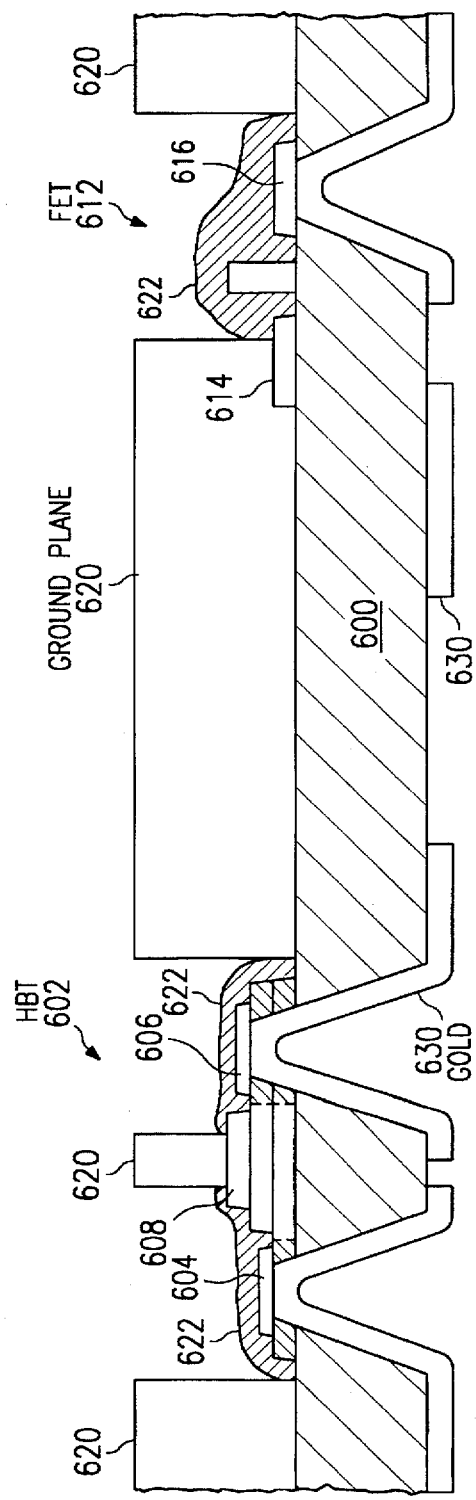

LOW THERMAL IMPEDANCE INTEGRATED CIRCUIT

This is a divisional of application Ser. No. 08/159,648, filed Nov. 30, 1993.

BACKGROUND OF THE INVENTION

The invention relates to electronic devices, and, more particularly, to integrated circuit thermal dissipation structures and methods of fabrication.

The continual demand for enhanced transistor and integrated circuit performance has resulted in downsizing transistor dimensions and increasing operating power densities. This aggravates heat dissipation problems, and for bipolar transistors the threat of secondary breakdown due to hot spots developing limits use of the transistor to the safe operating area (typically defined on a two-dimensional collector voltage-collector current graph). Of course, the safe operating area depends upon thermal design: the transistor junctions generate heat during operation, and the semiconductor material plus packaging materials conduct this heat to the ambient or heat sink. The ratio of the rise in junction temperature to the wattage being dissipated is termed the thermal resistance (thermal impedance) and typical values are 20 °C/W for a silicon integrated circuit in a 140-pin plastic quad flatpack; 150 °C/W for a silicon integrated circuit in an 8-pin small outline plastic package; and 10 °C/W for a 10 W gallium arsenide (GaAs) heterojunction bipolar transistor (HBT) in a monolithic microwave integrated circuit (MMIC). The thermal resistance scales with the chip area, so accurate comparisons would require comparable size chips. FIG. 1 illustrates in cross sectional elevation view a portion of MMIC 100 showing air bridge 102 connecting two source regions of MESFET 104 through a via to ground plane 106 plus microstrip transmission line 108 and wire bonding 110 to lead 122 on alumina substrate 120 which may connect to a coaxial cable. Note that the ground plane typically abuts a heat sink, and that the GaAs die for MMIC 100 is about 100 μm thick. The high thermal resistance for GaAs-based HBTs and MESFETs in part reflects the fact that silicon has three times the thermal conductivity of GaAs.

Heat dissipation limitations for GaAs-based HBTs remain a problem for MMICs and, in effect, require devices be spread out over a large area in order to lower the thermal resistance. This limits integration density.

Flip-chip bonding for silicon integrated circuits allows for a higher density of interconnections than with traditional wire bonding and tape automated bonding (TAB). In flip-chip bonding, solder bumps on the bonding pads on the frontside of a die are aligned with solder-wettable metallization on the carrier substrate, and a solder reflow forms all of the solder bonds simultaneously. For example, Pickering et al., 8 J. Vac. Sci. Tech. A 1503 (1990) discusses the reflow bonding process. In contrast to wire bonding, the flip-chip bond pads may be located anywhere on the frontside of a die and thus simplify integrated circuit layout.

Wong et al, Flip Chip Manufacturing Technology for GaAs MMIC, GaAs Mantech Conference Proceedings 240 (1993), apply flip-chip as a replacement for wirebonding of GaAs MMICs and thereby also facilitate automated hybrid module assembly of MMICs on a single substrate. In particular, Wong et al. follow standard MMIC manufacturing (e.g., patterned ion implantation, ohmic and gate metallization, microstrip and ground plane metallization, and air bridges) but omit wafer thinning and form silver bumps wherever grounding, input/output, and thermal dissipation are needed. The bumps are 75 μm tall and 150 μm diameter, and thermal bumps also cover the top of MESFET source air bridges to remove heat. FIG. 2 (not to scale) shows flip-chip MMIC 200 aligned with insulating substrate 220 and having silver bumps bonding the MMIC die to the substrate, including bump 210 bonding input/output pad 212 to substrate lead 222 and thermal bump 211 providing heat flow from air bridge 202 connected to the source of MESFET 204. The tops of the various bumps (210, 211, and others not shown) have different heights from the surface of the GaAs substrate due to their different bottom heigths, and substrate 220 must be pressed down (and deform) on the bumps to make contact with all of the different bumps.

However, this MMIC flip-chip approach has the problems of requiring a substrate with patterned input/output pads and lines plus thermal dissipation areas and alignment of the MMIC with the substrate. Note that the usual silicon integrated circuit flip-chip approach achieves alignment by reflowing solder bumps; this will not apply to the flip-chip of FIG. 2 due to the high melting point and lack of malleability of the silver bumps.

SUMMARY OF THE INVENTION

The present invention provides integrated circuits with an active-device-side (frontside) ground plane and backside contact pads plus optional backside passive components such as transmission lines, resistors, and capacitors. This permits good device heat sinking through the frontside ground plane without the usual flip-chip alignment problems.

BRIEF DESCRIPTION OF THE DRAWINGS

The drawings are schematic for clarity.

FIG. 3 is a cross sectional elevation view of a first preferred embodiment MMIC.

FIGS. 5a–b are cross sectional elevation views of steps in a further preferred embodiment method of fabrication.

FIGS. 6a–c are cross sectional elevation veiws of steps in preferred embodiment of fabrication including backside passive components.

DESCRIPTION OF THE PREFERRED EMBODIMENTS

First Preferred Embodiment Overview

Figure 1:
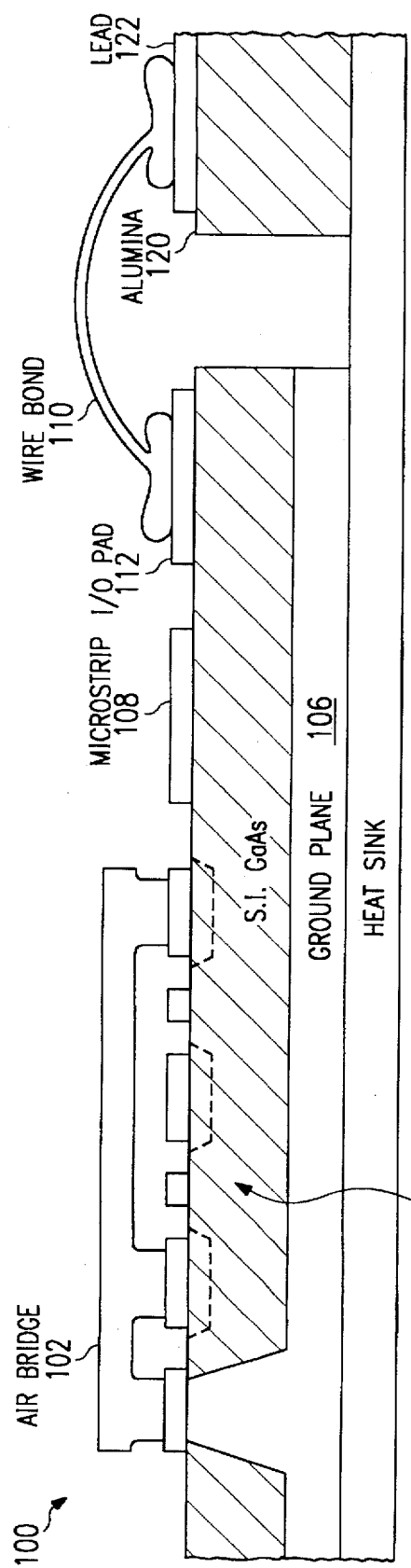
FIGS. 1–2 are cross sectional elevation views of known MMICs.

FIG. 3 heuristically shows in cross sectional elevation view first preferred embodiment monolithic microwave integrated circuit (MMIC) 300 wire bonded to lead 332 on alumina substrate 330 and with ground plane 306 attached to heat sink 320. MMIC 300 includes MESFET 304 with ground plane 306 also forming the air bridge on the source contacts of MESFET 304. The drain and gate of MESFET 304 connect through metallized vias such as 314 to backside input/ouput pad 312 and wire bond 310. the backside also contains microstrip 308. Thus MMIC 300 combines the wire bonding of MMIC 100 of FIG. 1 and the direct thermal contact to the source air bridge of flip-chip MMIC 200.

Figure 2:
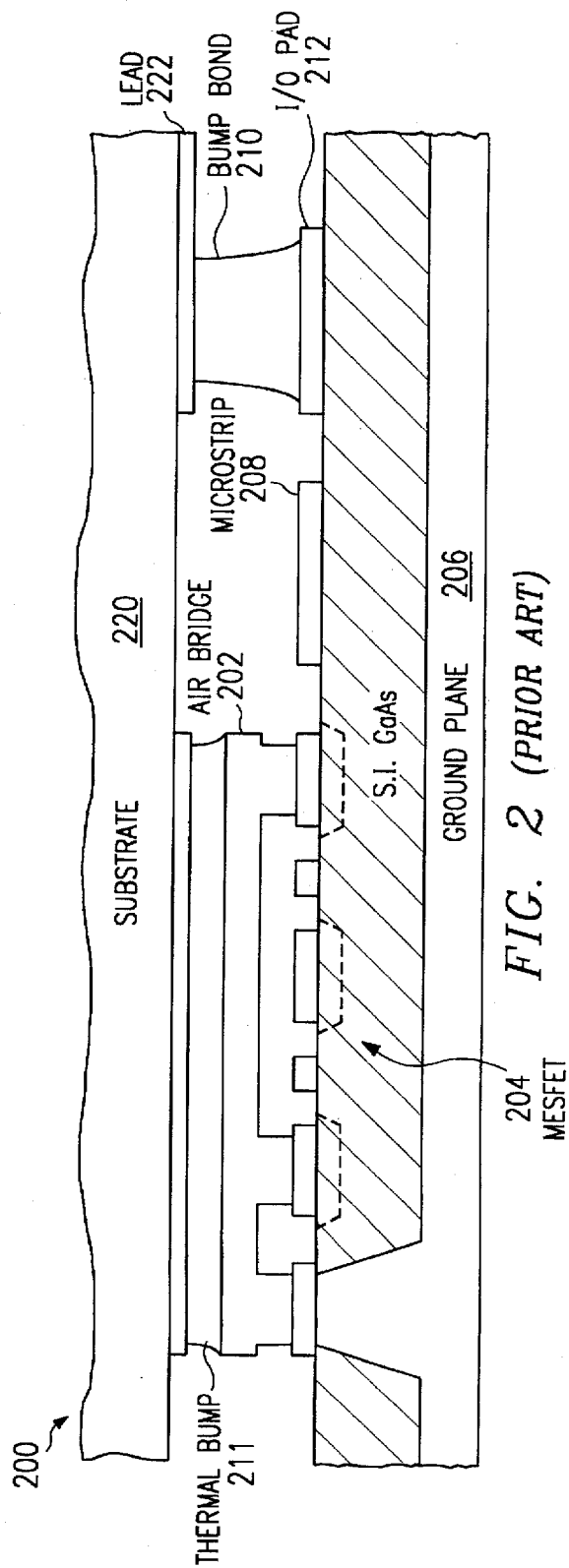

Further, MMIC 300 provides a frontside ground plane for direct overall contact on the frontside and consequent overall heat sinking and avoids the heat sink substrate patterning and alignment required for a flip-chip as MMIC 200 of FIG. 2. The frontside ground plane demands backside microstrip lines and input/output pads, but these may be easily fabricated by just patterning what would have been a backside ground plane.

In short, MMIC 300 provides a more extensive frontside heat sinking than a flip-chip MMIC 200 without the alignment of patterned pads of such a flip-chip. As the following sections show, MMIC 300 and similar other MMICs and discrete devices may be fabricated with simple processing steps after standard frontside processing for both MESFETs and HBTs.

Heterojunction Bipolar Transistor

Figure 4C:
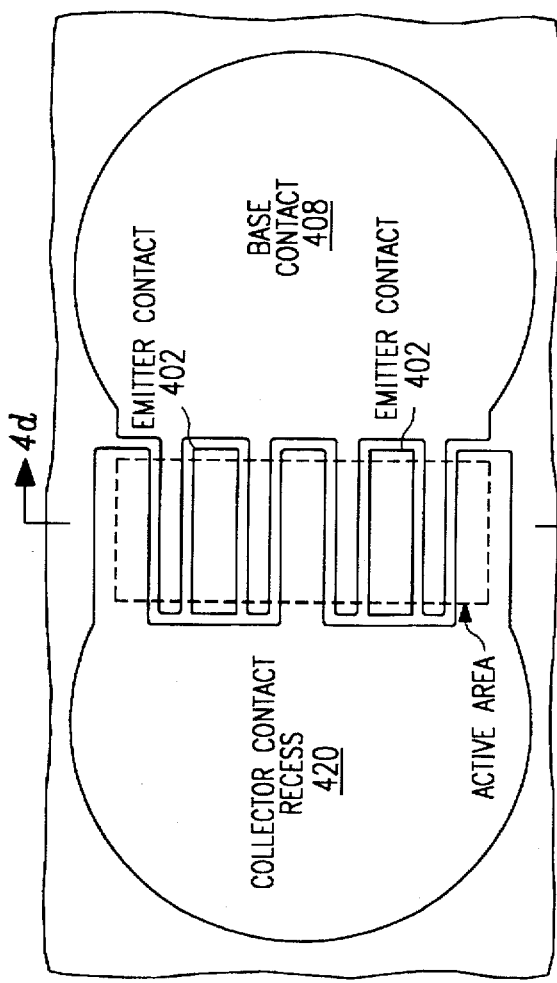
FIGS. 4a–r are plan and cross sectional elevation views of steps of a first preferred embodiment method of fabrication of MMICs.
Figure 4E:
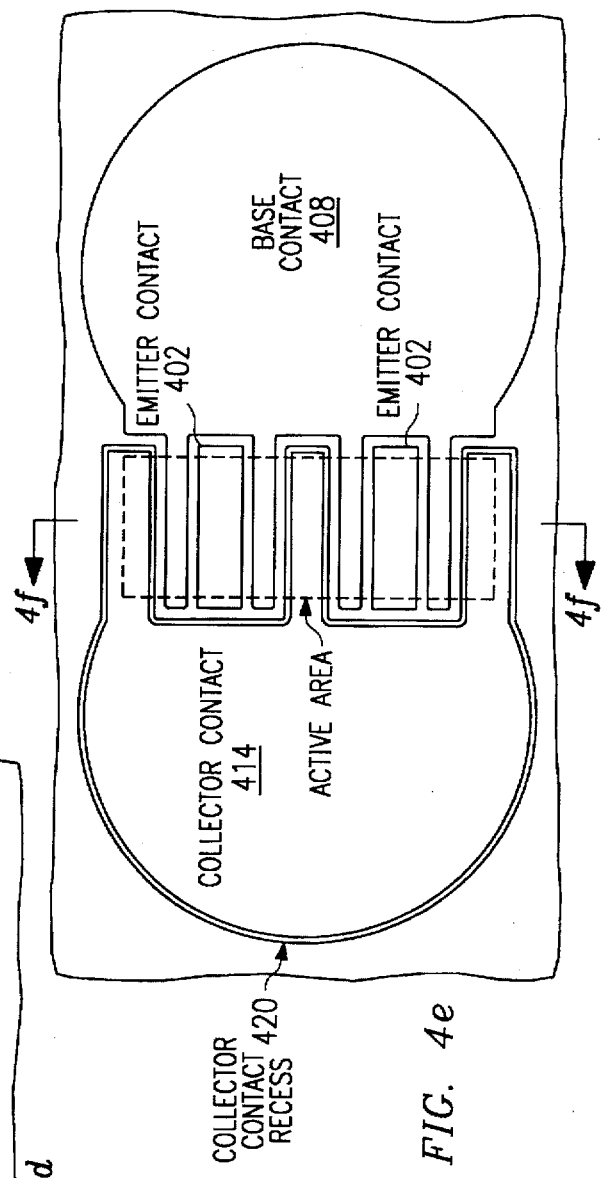
Figure 4R:
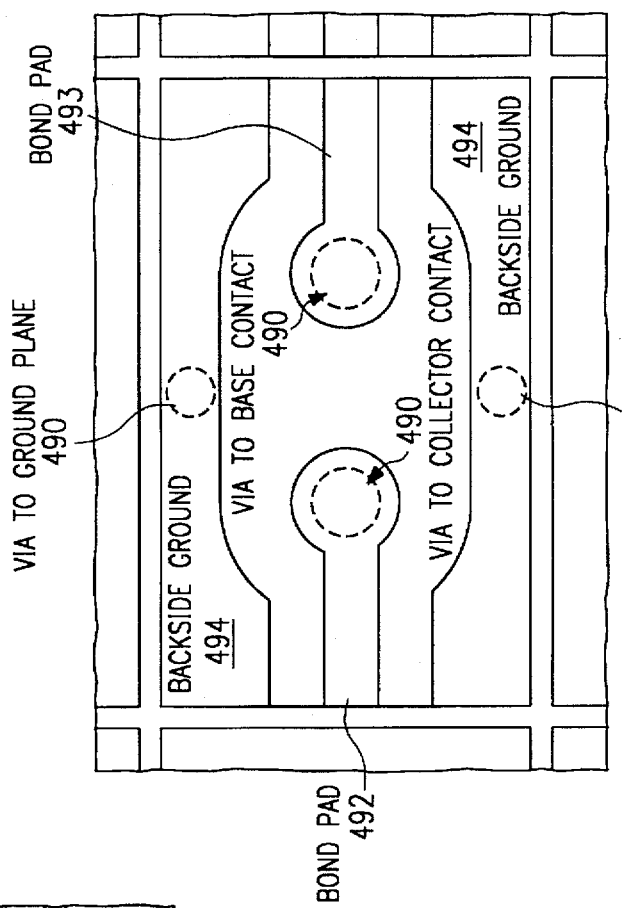

A first preferred embodiment method of fabrication creates a discrete multifinger heterojunction bipolar transistor (HBT) with frontside ground plane and includes the following steps as illustrated in cross sectional elevation and plan views in FIGS. 4a–r. For simplicity, the Figures illustrate an HBT with only two emitter fingers, four base contact fingers, and three collector contact fingers. Typically, high power microwave HBTs would have many more emitter, gate, and collector fingers.

(1) Begin with 625-μm-thick (100)-oriented semi-insulating GaAs wafer 450. Epitaxially grow by metalorganic molecular beam epitaxy (MOMBE) or metalorganic chemical vapor deposition (MOCVD) the layers listed in Table I on wafer 450. For MOMBE elemental Ga and Al sources provide the group-III species, and tertiarybutlyarsine and tertiarybutylphosphine provide the group-V species after cracking. Elemental tin provides the n type doping and elemental beryllium provides the p type doping. For MOCVD use trimethylgallium, trimethylaluminum and tertiarybutlyarsine with disilane providing silicon for the n type doping and carbon tetrachloride providing carbon for the p type doping.

TABLE I

| Layer | Material | Thickness | Doping level ($\times 10^{17}/cm^3$) |
| --- | --- | --- | --- |
| Cap | n+ GaAs | 200 nm | 15 |
| Grading | n $Al_xGa_{1-x}As$ | 100 nm | 5 |
| Emitter | n $Al_{0.35}Ga_{0.65}As$ | 100 nm | 2 |
| Spacer | n+ GaAs | 6 nm | 10 |
| Base | p++ GaAs | 80 nm | 300 |
| Collector | n− GaAs | 1000 nm | 0.1 |
| Subcollector | n+ GaAs | 1500 nm | 10 |

Note that x varies from 0 to 0.35, that the total thickness of these doped layers is only roughly 3 μm, and that all of the individual layers do not appear in the Figures.

(2) Spin on photoresist and pattern it to define the location of active device areas and then implant protons or oxygen to create crystal damage and thereby render semi-insulating all of the areas of the layers on wafer 450 outside of the active areas. Then strip the patterned photoresist.

(3) Spin on photoresist and pattern it to define the locations for emitter contacts 402 and evaporate and liftoff metal to form the emitter contacts. The metal includes three sublayers: first germanium (Ge), then nickel (Ni), and lastly gold (Au) for a bondable or platable surface. The metal has a total thickness of about 290 nm. Next, perform a wet etch with a mixture of sulfuric acid ($H_2SO_4$), hydorgen peroxide ($H_2O_2$), and water to remove the portions of the emitter layers 404 not protected by emitter contacts 402 down to base layer 406. Stopping in the 80 nm thick base layer after etching 400 nm may be performed without difficulty. The etch rate can be widely varied by varying the concentration of the ingredients. In particular, a mixture with volume ratios of acid (concentrated) to peroxide to water of 1 to 8 to 160 etches at roughly 300 nm/minute, whereas with ratio 3 to 1 to 1 will etch at roughly 2000 nm/minute. The emitter regions each has dimensions of 2 μm by 30 μm, so even with an isotropic wet etch, the etch does not overly undercut emitter contacts 402. See FIG. 4a for a plan view including one die area in a wafer and FIG. 4b for a cross sectional elevation view along line b—b of FIG. 4a. Note that the active area is indicated by a broken line FIG. 4a and that the vertical scale in FIG. 4b (and also all in other cross sectional elevation view Figures) is exaggerated for clarity.

(4) Spin on photoresist and pattern it to define the location of base contacts 408, evaporate and liftoff metal (290 nm of Ti/Pt/Au) base contact 408. Base contact 408 includes fingers adjacent the emitter contacts 402 and each has dimensions of 1 μm by 30 μm. Then, spin on photoresist and pattern it to define the collector contact recess 420. Using the patterned photoresist as an etch mask, perform a sulfuric acid/peroxide etch through GaAs base layer 406 and grading layers plus collector layer 410 and stop in n++GaAs subcollector layer 412. See plan view FIG. 4c and cross sectional elevation veiw FIG. 4d with the section being along line d—d of FIG. 4c. Note that the patterned photoresist is not shown in FIGS. 4c–d but remains on for the next step.

(5) Using the patterned photoresist from step (4) for etching collector contact recess 420, evaporate and liftoff metal (290 nm of Ge/Ni/Au) to form collector contacts 414. The collector contact has fingers adjacent the base contact fingers, and each collector contact finger has dimensions of 2 μm by 30 μm. Note that the wet etch of collector contact recess 420 undercuts the patterned photoresist, and thus collector contact 414 will be spaced slightly from the edge of recess 420. Strip the patterned photoresist. This completes the HBT devices on the frontside of wafer 450 as shown in plan view by FIG. 4e and in cross sectional elevation view in FIG. 4f with the section along line f—f of FIG. 4e. Base contact 408 and collector contact 414 are both thickened in the portions away from the base and collector contact fingers by liftoff of 500 nm of Ti/Cr/Pt/Au. The chromium will act as an etchstop in the via etch step infra.

(6) Deposit by chemical vapor deposition silicon nitride ($Si_3N_4$) 455 to a thickness of 200 nm over the entire frontside of wafer 450. The nitride deposits conformally and acts as a passivant and a protective layer for the wafer. Then spin on photoresist and pattern it to define the location for first level metal on wafer 450. First level metal will cover all portions of wafer 450 away from the HBT (including the base and collector contacts) plus will cover the emitter contacts. Next, reactive ion etch nitride 455 with the patterned photoresist as etch mask, and then evaporate first level metal (290 nm of Ti/Pt/Au) 460 and liftoff the patterned photoresist (plus metal) by dissolution in acetone. See FIG. 4g for a plan view and FIGS. 4h–i for the cross sectional elevation views along lines h—h and i—i, respectively, of FIG. 4g. These Figures have reduced the scale with respect to the preceding Figures in order to show the portion of wafer 450 containing an entire die-to-be plus the edges of abutting dice-to-be.

(7) Spin on photoresist 470 and pattern it to define ground plane direct contact areas. Most of the surface of wafer 450 will be in direct contact to the ground plane as will the emitter contacts 402. Essentially, photoresist 470 just covers nitride 455 from the previous step. Hard bake the patterned photoresist to make it flow slightly to collapse vertical sidewalls. Next, evaporate on a thin layer of Ti/Au (100 nm), then sputter on thin (50 nm) layer of gold to from layer 472 which will be the basis for a later plating of thick gold. The flowing of photoresist 470 insures a continuous thin metal layer 472. Then spin on photoresist layer 474 and pattern it to define the location of the emitter contacts' air bridge (essentially over the active area) plus expose the first level metal around the mesa but cover up scribe lines between dice-to-be. See FIGS. 4j–k showing the same sections as FIGS. 4h–i and illustrating the two photoresist layers plus thin gold. The piece of photoresist 474 in the righthand portion of FIG. 4j covers a scribe line.

(8) Electroplate gold to a thickness of roughly 3 μm using the exposed portion of thin metal 472 as the initiating layer. This forms air bridge 476 connecting the emitter contacts 402 with gold 478 plated on first level metal 460 away from the mesa. After the plating, strip photoresist 474, exposed thin metal 472, and photoresist 470. See FIG. 4l–m showing the same sections and FIGS. 4j–k, respectively.

Figure 4P:
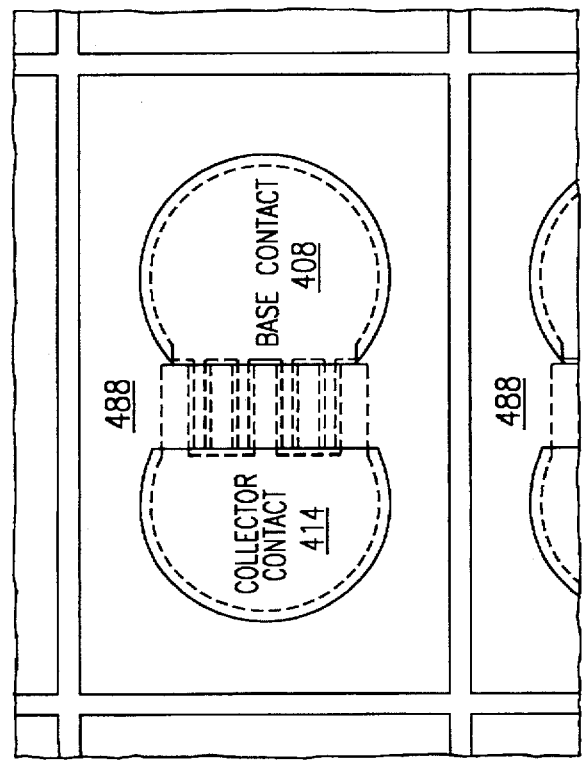

(9) Deposit layer 485 of polyimide (1 to 3 μm thick); this will cover air bridge 476. Next, spin on photoresist and pattern it and then etch the exposed polyimide 485 to remove the polyimide in locations to expose portions of underlying gold (air bridge 476 and metal 478). However, retain polyimide in the areas of the dice edges. Strip the photoresist and electroplate gold 488 to a thickness suitable for chip mounting, typically 10 μm. The titanium in thin metal layer 472 prevents any downward plating of gold from the bottom of air bridge 476 during this plating. The ground plane thus consists of two plated layers: gold 488 on air bridge 476/gold 478. After completing the plating, remove the polyimide in the areas of the dice edges to facilitate wafer scribing. See FIGS. 4n–o which show the same sections as FIGS. 4j–k, respectively, and FIG. 4p which is a plan view analogous to FIG. 4g. The plated surface is roughly planar with the highest points at the air bridges 476; this insures that good thermal contact at the air bridges will be made with the heat sink eventually pressed against the ground plane for flip-chip mounting.

(10) Mount wafer 450 with frontside ground plane gold plate 488 down on quartz carrier 490 using a layer of wax; the greater height of gold 488 over air bridge 476 than over metal 478 implies thinner wax over the air bridge as suggested by the indentation in FIG. 4q. Next, thin wafer 450 to a thickness of about 100 μm from the backside. Then spin on photoresist (on the backside) and pattern it to define 50 μm diameter tapered vias 490 to extend to the base contacts 408, to the collector contacts 414, and to the frontside ground planes near the ends of air bridge 476. Then etch the vias, stopping on the chromium layer applied in step (5) for the base and colletor contacts and stopping in the first level metal or overlying gold 478 for the vias to the ground plane, using reactive ion etching (RIE) with $CCl_2F_2$. Then strip the photoresist. Next, sputter on 20 nm of titanium followed by 20 nm of gold to the entire backside (including the vias). Then spin on photoresist and pattern it to define locations for bond pads 492–493 and interconnections between them and vias 490 to the collector and base contacts, and also the location for backside grounds 494. Lastly, electroplate gold to a thickness of 3 μm, this metal layer extends down the vias to connect with the base and collector contacts and the frontside ground plane, and strip the photoresist plus the exposed 40 nm of Ti/Au. See FIG. 4q for a cross sectional elevation view along the same section as FIG. 4i and FIG. 4r for a backside plan view. Note that the two backside grounds 494 serve as the grounds for a coplanar waveguide with center lead bond pad 492 (connected to collector contact 414) and a coplanar waveguide with center lead bond pad 493 (connected to base contact 408). In this case the alumina substrate 330 of FIG. 3 would have coplanar waveguides on its upper surface for wirebonding to the waveguides with bond pads 492 and 493. Other preferred embodiments infra include items such as transmission lines and inductors and capacitor plates in this backside definition and plating.

(11) Remove wafer 450 from its quartz carrier, mount on vinyl tape, and scribe and break into dice. Each die may then be mounted with (frontside) gold 488 (and thus HBT emitter) down on a low-thermal-resistance baseplate, such as gold or diamond, using gold-tin solder or other such attachment methods. Electrical contacts to the bond pads 492 (and thus to HBT base and collector) may be by ball bonding, as illustrated in FIG. 3 by wire bond 310, and frontside ground plane 488 on a heat sink corresponds to ground plane 306 on heat sink 320 of FIG. 3. Of course, FIG. 4q appears upside down when compared to FIG. 3. This completes the fabrication.

Alternative fabrication embodiments include substitution of various steps such as uniform deposition or plating of metal followed by patterned photoresist and etching in place of the previously described selective plating using patterned photoresist or dielectric.

Further, the two phase plating forming frontside ground plane metal 476–478 and 488 in steps (7)–(9) could be replaced by a single plating step as follows. After step (6) (cross sectional elevation view FIGS. 4h–i), sputter on a thin (50 nm) gold layer overall, and then spin on photoresist and pattern it to expose all areas which will be in direct contact with the frontside ground plane 588. Then electroplate gold to form the frontside ground plane 588 (5–15 μm thick). Next, strip the photoresist and exposed thin gold. See FIGS. 5a–b. Lastly, continue with steps (10) and (11).

However, the two step ground plane plating has the advantage that the air bridge first plating is relatively thin and thus does not need thick patterned photoresist. Also, air bridge has relatively small area so the photoresists and thin metal 472 are easy to strip. The second step thick plating uses polyimide coverage and no (thick) photoresist for patternless plating with the areas plated being continuous.

MMIC with HBTs and FETs

The foregoing preferred embodiment fabrication methods for HBTs easily extend to the inclusion of other device types such as field effect transistors (FETs). For example, the HBTs may be isolated by a mesa etch down to the semi-insulating wafer; this would require a photoresist masking about the HBT prior to the first level metal step and an etch. The FETs would be then fabricated, and the preceding fabrication continued with first level metal. In particular, FET source/drains and channel regions may be implanted followed by source/drain ohmic metal liftoff and gate metal liftoff together with chromium layers added where vias from the backside would come through to thin metal. Alternatively, the FETs could use doped layers originally grown for or below the HBT layers or use an epitaxial overgrowth. Indeed, MMICs with multiple HBTs and/or FETs may be made with the nongrounded emitter, base, collector, source, drain, and gate contacts connected by vias to the backside as described in the next section.

MMIC with Backside Passive Components

The foregoing preferred embodiment frontside fabrication methods may be combined with fabrication of passive components such as resistors, transmission lines (microstrip lines using the frontside ground plane or coplanar waveguides), inductors, interconnects, and bond pads and the backside and connected to the frontside devices by vias. In particular, a preferred embodiment method of fabrication includes the following steps.

Figure 6C:
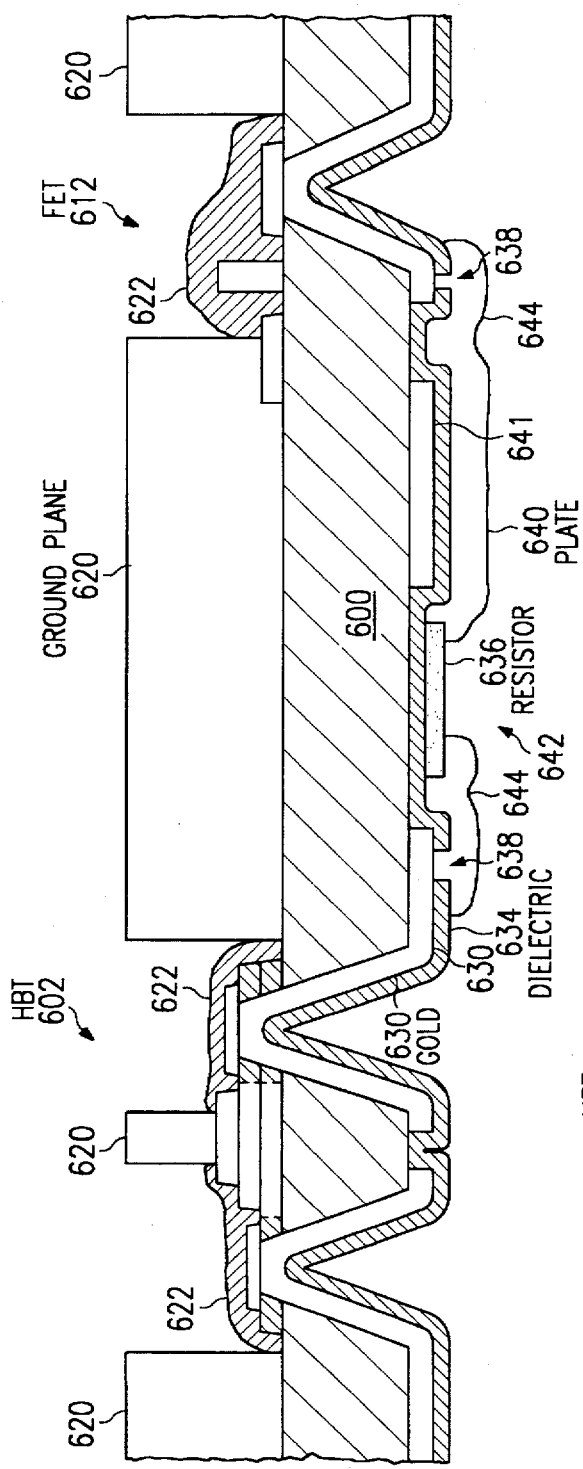

(1) Form frontside active devices such as HBTs and FETs together with a plated frontside ground plane as previously described on semi-insulating GaAs wafer 600. FIG. 6a shows in simplified cross sectional elevation view mesa isolated HBT 602 with nongrounded collector and base contacts 604 and 606 plus emitter contact 608 abutting ground plane 620 and FET 612 with nongrounded drain contact 616 plus source contact 614 abutting ground plane 620; the gate contact lies out of the section of the drawing. Collector contact 604, base contact 606, the gate contact, and drain contact 616 each has a chromium etch stop layer for via formation. Nitride 622 covers the nongrounded contacts.

(2) Attach wafer 600 by its frontside ground plane 620 to a quartz carrier and thin the wafer to a thickness 100 μm; this thickness will allow microstrip lines to be on the backside and close enough to ground plane 620 to provide transimissin lines. Spin on photoresist on the backside of wafer 600 and pattern it to define locations for vias to the nongrounded device contacts on the frontside. Then etch tapered vias with the patterned photoresist as etch mask. The etch stops on the chromium layers on the contacts. Strip the photoresist. Next, sputter on a thin (50 nm) Ti/Au layer over all of the backside; this metal layer extends down the sides of the vias. Then spin on photoresist and pattern it to define the location of transmission lines (microstrip or coplanar waveguide), inductors, capacitor bottom plates, some interconnects (including down into the vias), and bond pads. Plate gold 630 to a thickness of 3 μm to form the microstrip lines, inductors, capacitor bottom plates, interconnects, and bond pads. Strip the patterned photoresist and remove the exposed thin gold. See FIG. 6b.

(3) Deposit layer 634 of capacitor dielectric over all of the backside; the dielectric may be nitride of thickness 50 nm. Next, spin on photoresist and pattern it to define locations for thin film resistors 636. Then sputter on thin film resistor material (tantalum nitride, nickel chromium) and lift off the patterned photoresist plus resistor material. Spin on photoresist and pattern it to define contacts windows 638 through capacitor dielectric 634; such windows may include contact openings to the microstrip lines and interconnections previously made. Next, use the patterned photoresist to reactive ion etch the contact windows 638 through dielectric 634. Lastly, spin on photoresist and pattern it to define the capacitor top plates 640 (opposite botom plates 641) and contacts 642 to the ends of thin film resistors 636 plus further interconnects needed, including those running through the contact windows 638. Evaporate on metal 644 (such as Ti/Pt/Au) and liftoff the patterned photoresist to form these items. See FIG. 6c. Wafer 600 can now be removed from the quartz carrier and mounted with ground plane 620 on a heat sink and backside bond pads wire bonded for electrical contact.

MMIC with Frontside Passive Components

Figure 7:
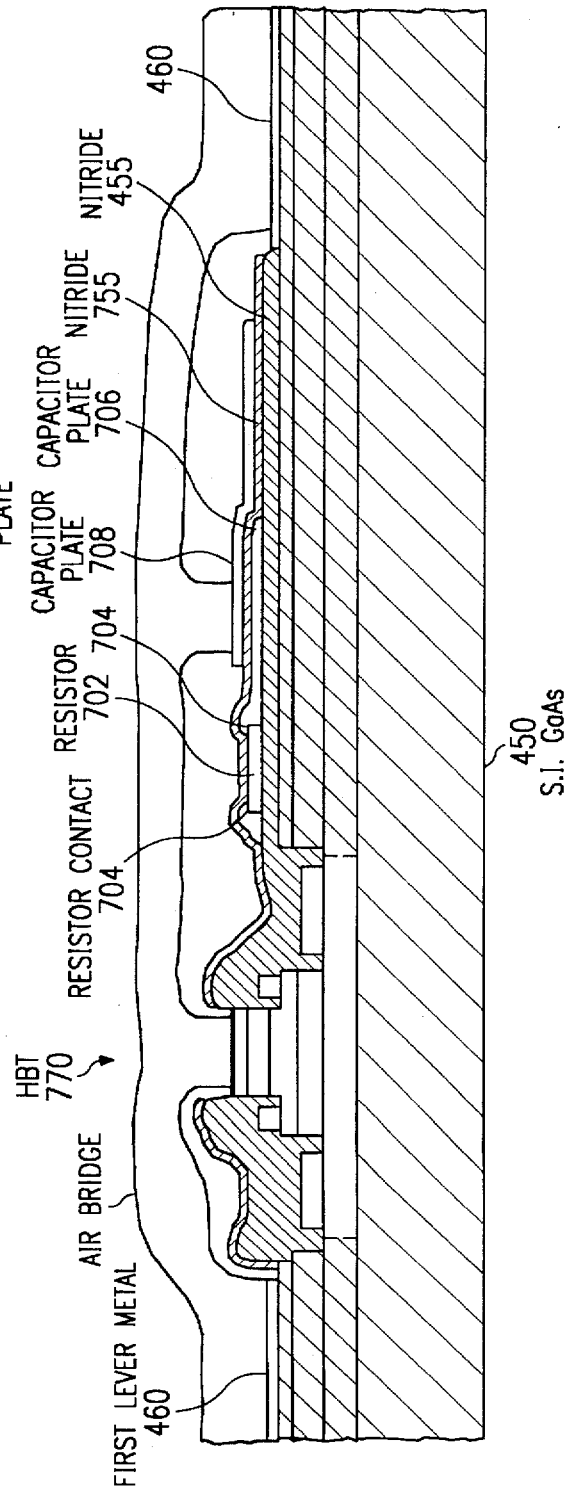
FIG. 7 is a cross sectional elevation view showing frontside passive components.

After formation of frontside active devices (HBTs and/or FETs) but before ground plane plating, passive components such as resistors and capacitors may also be formed on the frontside. In particular, in previously described step (6) after the deposition of nitride 455 but prior to patterning and etching plus first level metal liftoff, spin on photoresist and pattern it to define locations for thin film resistors 702. Next, sputter on thin film resistor material such as tantalum nitride or nickel chromium and liftoff the patterned photoresist. Then spin on photoresist and pattern it to define resistor contact 704 locations plus capacitor lower plate 706 locations. Then sputter on 300 nm of Ti/Pt/Au and liftoff the patterned photoresist to form resistor contacts 704 and capacitor lower plates 706 and interconnects. Next, spin on photoresist and pattern it to define the locations for first level metal. Then reactive ion etch nitride 455 using the patterned photoresist followed by evaporation and liftoff of first level metal 460 (290 nm of Ti/Pt/Au). Next, deposit capacitor dielectric 755 (50 nm of silicon nitride) and again spin on photoresist and pattern it to define the locations for capacitor top plates 708, and evaporate metal and liftoff to form the top plates. Lastly, spin on photoresist and pattern it to protect areas not to be in direct ground plane contact; this exposes nitride 755 over first level metal 460 and other areas of interconnets to be grounded. Then hardbake the photoresist to flow and round the corners, then reactive ion etch nitride 755 using the patterned photoresist to expose the underlying metal. Then continue as in step (7) by evaporation of Ti/Au (100 nm) followed by plating. FIG. 7 is analogoud to FIG. 41 and shows one finger HBT 770 with resistor 702 and capacitor 706–708. Vias to the backside may be made to interconnects for resistor 702 and capacitor plates 706 or 708 by including chromium etch stops in the metal.

Modifications and Advantages

The preferred embodiments may be varied in many ways while retaining one or more of the features of a frontside ground plane with vias to backside contacts and passive components on backside or frontside or both.

For example, the dimensions and layouts of the devices may be varied. The semiconductor materials may be replaced with other III–V compounds such as InP, GaAsP, InGaAs, InAlGaAs, . . . , or other semiconductors generally such as silicon, germanium, silicon-germanium alloys, II–VI compounds such as HgCdTe, or silicon carbide and diamond. Semiconductor-on-insulator substrates or bonded wafers may replace the semi-insulating wafer. The devices integrated may include homojunction bipolars, double heterojunction bipolars, junction FETs, thyristors, and so forth.

What is claimed is:

1. A method of fabrication of an integrated circuit, comprising the steps of:
   (a) forming a transistor at a frontside surface of a substrate;
   (b) forming a ground plane by electroplating, said ground plane being formed over and connecting to said frontside surface;
   (c) forming vias through said substrate; and
   (d) forming bond pads at a backside surface of said substrate, said backside surface opposite said frontside surface, said bond pads coupling to said transistor through said vias.

2. The method of claim 1, wherein said electroplating includes a first plating with a patterned photoresist mask over said frontside surface and transistor plus a second plating without a patterned photoresist mask and plating from a metal structure formed by said first plating.

3. The method of claim 1, further comprising the step of forming passive components at said backside surface and coupled to said transistor.

4. The method of claim 1, further comprising the step of forming passive components at said frontside surface and coupled to said transistor, said step of forming passive components being performed prior to said step of forming a ground plane.

5. A method of fabrication of an integrated circuit comprising the steps of:
   (a) forming a transistor at a frontside surface of a substrate;
   (b) forming a ground plane over and connecting to said frontside surface;
   (c) forming vias through said substrate;
   (d) forming bond pads at a backside surface of said substrate, said backside surface opposite said frontside surface, said bond pads coupling to said transistor through said vias; and
   (e) forming passive components at said backside surface and coupled to said transistor.

6. The method of claim 5 wherein said step of forming a ground plane includes electroplating.

7. The method of claim 6 wherein said electroplating includes a first plating with a patterned photoresist mask over said frontside surface and transistor plus a second plating without a patterned photoresist mask and plating from a metal structure formed by said first plating.

8. The method of claim 5 further comprising the step of forming passive components at said frontside surface and coupled to said transistor, said step of forming frontside passive components being performed prior to said step of forming a ground plane.

9. A method of fabrication of an integrated circuit, comprising the steps of:
   (a) forming a transistor and passive components at a frontside surface of a substrate, said transistor and said passive components being electrically coupled;
   (b) forming a ground plane over and connecting to said frontside surface;
   (c) forming vias through said substrate; and
   (d) forming bond pads at a backside surface of said substrate, said backside surface opposite said frontside surface, said bond pads coupling to said transistor through said vias.

10. The method of claim 9 wherein said step of forming a ground plane includes electroplating.

11. The method of claim 10 wherein said electroplating includes a first plating with a patterned photoresist mask over said frontside surface and transistor plus a second plating without a patterned photoresist mask and plating from a metal structure formed by said first plating.

12. The method of claim 9 further comprising the step of forming passive components at said backside surface and coupled to said transistor.

* * * * *